US008411456B2

(12) United States Patent
Sato et al.

(10) Patent No.: US 8,411,456 B2
(45) Date of Patent: Apr. 2, 2013

(54) INVERTER DEVICE HAVING SEPARATED MODULE TERMINAL

(75) Inventors: Shinichi Sato, Tochigi (JP); Noriya Kishino, Tochigi (JP); Jin Kurihara, Tochigi (JP)

(73) Assignee: Keihin Corporation, Tokyo (JP)

( * ) Notice: Subject to any disclaimer, the term of this patent is extended or adjusted under 35 U.S.C. 154(b) by 1245 days.

(21) Appl. No.: 12/203,984

(22) Filed: Sep. 4, 2008

(65) Prior Publication Data

US 2009/0059637 A1 Mar. 5, 2009

(30) Foreign Application Priority Data

Sep. 5, 2007  (JP) ................................. 2007-229883

(51) Int. Cl.
*H01R 9/00* (2006.01)

(52) U.S. Cl. ......... 361/775; 361/611; 361/637; 361/648

(58) Field of Classification Search .................. 361/611, 361/637–639, 648–651, 658, 728, 772, 775, 361/784, 807, 820, 736, 752; 174/255, 258, 174/520; 257/678, 687, 690–693, 700–704, 257/723, 724
See application file for complete search history.

(56) References Cited

U.S. PATENT DOCUMENTS

| 6,417,532 B2* | 7/2002 | Tsunoda et al. ............... 257/219 |
| 8,054,633 B2* | 11/2011 | Suwa et al. .................... 361/728 |
| 2005/0068820 A1* | 3/2005 | Radosevich et al. .......... 365/202 |
| 2005/0123372 A1* | 6/2005 | Sato ............................... 411/32 |

FOREIGN PATENT DOCUMENTS

| JP | 4-036273 U | 3/1992 |
| JP | 2001-284524 A | 10/2001 |
| JP | 2002-291261 A | 10/2002 |
| JP | 2003-133515 A | 5/2003 |
| JP | 2003-230286 A | 8/2003 |
| JP | 2003230286 * | 8/2003 |
| JP | 2004-349437 A | 12/2004 |

OTHER PUBLICATIONS

Japanese Office Action dated Jun. 27, 2012, issued in corresponding Japanese Patent Application No. 2007-229883, with English translation (4 pages).

* cited by examiner

*Primary Examiner* — Yuriy Semenenko
(74) *Attorney, Agent, or Firm* — Westerman, Hattori, Daniels & Adrian, LLP

(57) ABSTRACT

An inverter device is provided with a semiconductor device, an input terminal, an intermediate terminal, an output terminal and an insulated substrate on which the semiconductor device, the input terminal, the intermediate terminal and the output terminal are mounted. Each of the input terminal, the intermediate terminal and the output terminal is a separated module such that one of the input terminal, the intermediate terminal and the output terminal is spatially independent from the other.

5 Claims, 16 Drawing Sheets

INVERTER DEVICE HAVING SEPARATED MODULE TERMINAL

BACKGROUND OF THE INVENTION

The present invention relates to an inverter device, and particularly to an inverter device having a separated module terminal on an insulated substrate.

In recent years, a performance required in an electrically driven device such as a motor and a compressor has been highly-developed, and due to such circumstances, an inverter device has been applied to drive the electrically driven device. In such a structure, the inverter device is provided with not only a semiconductor device, such as a transistor, and a controller for controlling an operation of the semiconductor device, but also an input terminal and an output terminal, both for the semiconductor device, and an intermediate terminal connecting the semiconductor device and the controller.

In such a structure, for making the device configuration simple and compact, the input terminal and the like are mounted to a single case as a single piece produced through an integral molding.

Specifically, Japanese Patent Application Laid-Open Publication 2002-291261 discloses a structure in which a large-size terminal, for connection an inverter device and a compressor-motor, and a small-size signal terminal, for transmitting a switching-command signal to the inverter device, are mounted to a resin-made single module case produced through an integral molding for surrounding an aluminum substrate.

Likewise, Japanese Patent Application Laid-Open Publication 2003-133515 discloses a structure in which a P terminal, an N terminal and an alternate current terminal as an external-connection main circuit terminal for a semiconductor tip, and a signal terminal for the semiconductor tip are mounted to a resin-made single module case provided for surrounding an insulated substrate through an integral molding.

SUMMARY OF THE INVENTION

However, according to several studies conducted by the present inventors of the present invention, in the structure of Japanese Patent Application Laid-Open Publication 2002-291261, since the large-size terminal and the small-size signal terminal both for the inverter device are mounted to the resin-made single module case produced through the integral molding, vibrations from external devices such a compressor-motor and the like are transmitted to the terminals in direct, and it is thought that this causes connection states of solder connecting portions for connecting pad surfaces of the aluminum substrate and pad portions of the terminals with solders to be affected. Also, since the terminals are unitized as like a single module to the resin-made module case, there are positional deviations between the pad surfaces of the aluminum substrate and the pad portions of the terminals, and it is difficult that the pad portions of the terminals are respectively positioned to the pad surfaces of the aluminum substrate in correct. Such a situation is seen in the structure Japanese Patent Application Laid-Open Publication 2003-133515.

After such studies conducted by the present inventors, the present invention has been completed, and an object of the present invention is to provide an inverter device capable of restraining the affects of the vibrations from the external devices and restraining the positional deviations between the pad surfaces of the insulated substrate and the pad portions of the terminals, with a compact structure.

In order to attain such an object, in one aspect of the present invention, an inverter device, comprises: a semiconductor device; an input terminal; an intermediate terminal; an output terminal; and an insulated substrate on which the semiconductor device, the input terminal, the intermediate terminal and the output terminal are mounted, with each of the input terminal, the intermediate terminal and the output terminal being for the semiconductor device to be an separated module such that one of the input terminal, the intermediate terminal and the output terminal is spatially independent from the other.

Due to such an aspect, since the input terminal, the intermediate terminal and the output terminal are made as the separated modules that are spatially independent from each other on the insulated substrate, even in such a situation that a smoothing capacitor is connected with the input terminal (a P terminal and an N terminal), a controller is connected with the intermediate terminal and a load such as a motor and a compressor is connected with the output terminal (a U-phase terminal, a V-phase terminal and a W-phase terminal), mechanical vibrations inputted from the smoothing capacitor and the load can be transmitted to the insulated substrate through the input terminal and the output terminal, correspondingly, and thus mechanical vibrations form such external devices can be prevented form transmitting to the solder connecting portions of the other terminals in direct, thereby realizing the inverter device that is less affected by the mechanical vibrations from surroundings including the external devices. Also, since the input terminal, the output terminal and the intermediate terminal are made as the separated modules that are spatially independent from each other on the insulated substrate, positional deviations between the pad surfaces of the insulated substrate and the pad portions of such terminals can be restrained. Still also, by causing such terminals to form the separated modules that are spatially independent from each other on the insulated substrate, there can be provided the inverter device capable of having a general versatility.

In another aspect of the present invention, the inverter device further comprises a depressing member depressing the input terminal, the intermediate terminal and the output terminal each of which is the separated module.

Due to such an aspect with the depressing member, the connecting state between the insulated substrate and each of the input terminal, the output terminal and the intermediate terminal can be kept in a reliable condition.

In another aspect of the present invention, each of the input terminal, the intermediate terminal and the output terminal has a solder connecting portion soldering the insulated substrate, and the depressing member has a depressing portion depressing each of the input terminal, the intermediate terminal and the output terminal downward from above at a position distant from the solder connecting portion.

Due to such an aspect with the solder connecting portion and the depressing portion, the connecting state between the insulated substrate and each of the input terminal, the output terminal and the intermediate terminal can be kept in a reliable condition without the stress concentration on the older connecting portion.

In another aspect of the present invention, the depressing portion has a deformation surface deformed toward each of the input terminal, the intermediate terminal and the output terminal.

Due to such an aspect with the deformation surface, the connecting state between the insulated substrate and each of the input terminal, the output terminal and the intermediate terminal can be kept in a reliable condition with such a simplified and facilitated structure.

In another aspect of the present invention, each of the input terminal, the intermediate terminal and the output terminal has a split pin projecting toward the depressing portion.

Due to such an aspect with the split pin, the connecting state between the insulated substrate and each of the input terminal, the output terminal and the intermediate terminal can be kept in a more reliable condition.

Other and further features, advantages, and benefits of the present invention will become more apparent from the following description taken in conjunction with the following drawings.

DETAILED DESCRIPTION OF THE PREFERED EMBODIMENT

Hereinafter, an inverter device having a separated module terminal of an embodiment according to the present invention is described below with suitable reference to the attached drawings. Incidentally, x-axis, y-axis and z-axis form an orthogonal coordinate system.

First, a whole structure of the inverter device having the separated module terminal is described mainly with reference to FIGS. 1 to 4.

Figure 1:
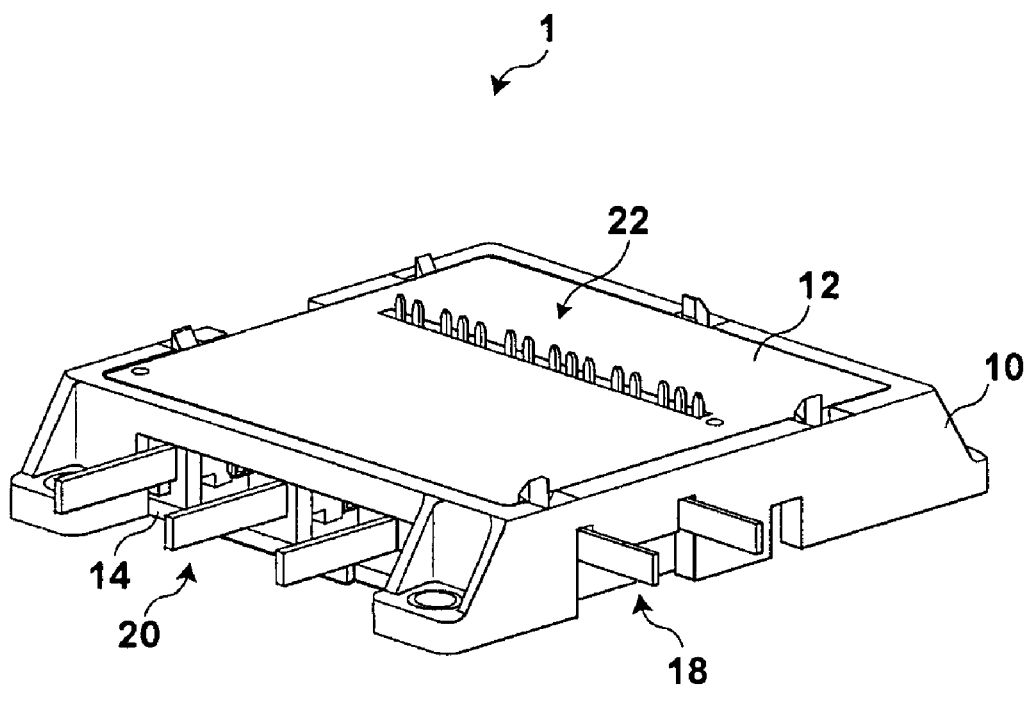
FIG. 1 is a perspective view of an inverter device having a separated module terminal of an embodiment according to the present invention.
Figure 1:
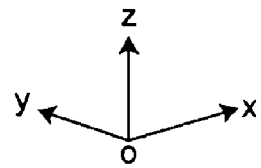
Figure 2:
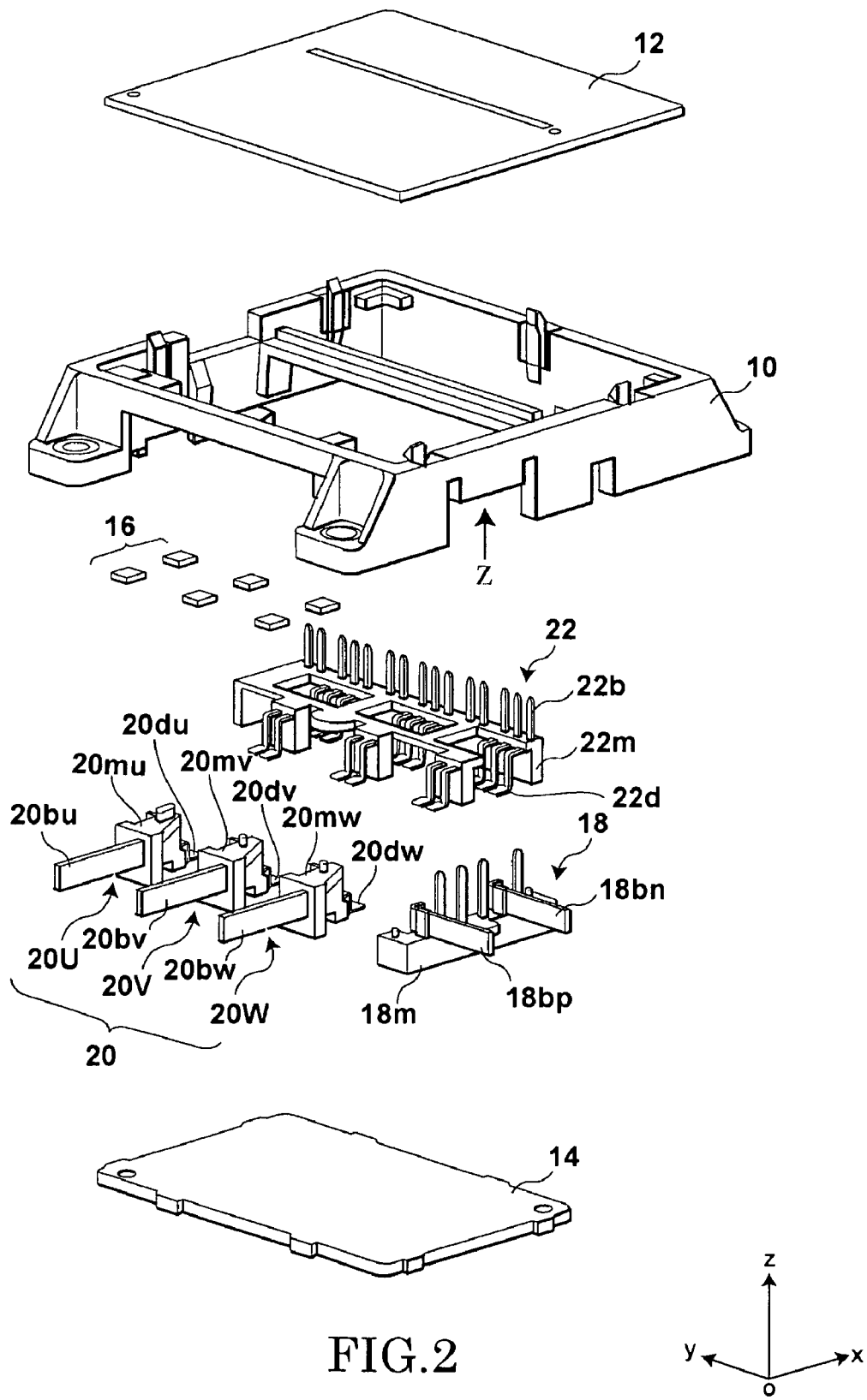
FIG. 2 is an exploded perspective view of the inverter device of the present embodiment.
Figure 3:
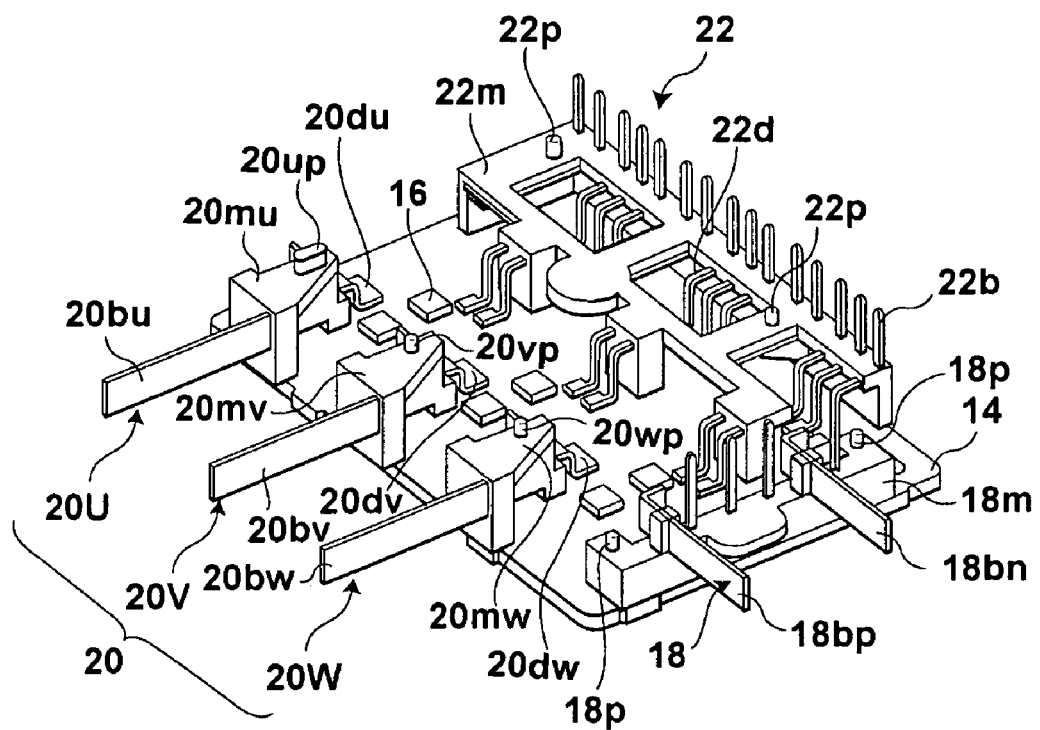
FIG. 3 is a perspective view showing a state in which the separated module terminal and the like are mounted on an insulated substrate in the inverter device of the present embodiment.
Figure 4:
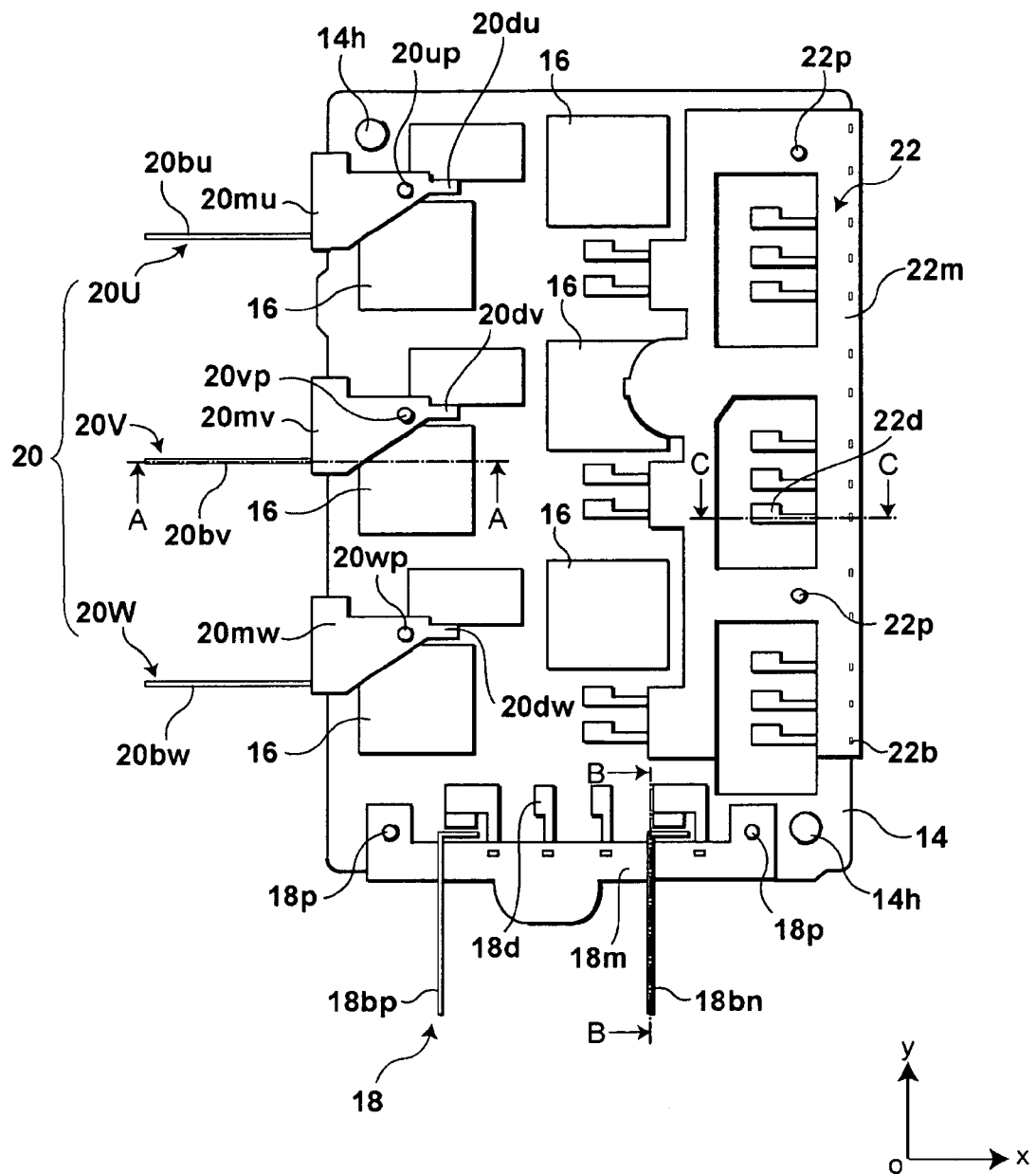
FIG. 4 is a plan view along a negative direction of a z-axis of FIG. 3 of the present embodiment.

FIG. 1 is a perspective view of the inverter device having the separated module terminal of the present embodiment, and FIG. 2 is an exploded perspective view of the inverter device of the present embodiment. FIG. 3 is a perspective view showing a state in which the separated module terminal and the like are mounted onto an insulated substrate in the inverter device of the present embodiment, and FIG. 4 is a plan view along a negative direction of the z-axis of FIG. 3 of the present embodiment.

As shown in FIGS. 1 to 4, the inverter device 1 of the present embodiment is provided with a case 10 as a depressing member that is made of a resin. In the inverter device 1, a control substrate 12 is fixed onto the case 10 and an insulated substrate 14 is accommodated in and fixed to the case 10. Although not shown in the drawings, the case 10 is fixed to a heat dissipation member that is made of a metal or the like by a fastening member such as a bolt. Also, although not shown in the drawings, the insulated substrate 14 is connected with the heat dissipation member through a heat conduction material and has a two-layered structure, in which an insulated layer made of a resin is formed on a metal layer made of an aluminum material or the like. Incidentally, although a heat conduction grease can be used for the heat conduction material, a gel-like or a particulate heat conduction material, or an adhesive material having a heat conduction property can be used, too.

Onto the insulated substrate 14 accommodated in and fixed to the case 10, each semiconductor device 16 such as an insulated gate bipolar transistor is mounted. Although not shown in the drawings, the semiconductor device 16 is adhered onto surfaces of metal layers as pad surfaces of the insulated substrate 14 with solders, correspondingly at window portions opened through an insulated layer to expose the metal layers in the insulated substrate 14.

In addition to the semiconductor device 16, onto the insulated substrate 14, an input terminal 18, an output terminal 20 and an intermediate terminal 22 are mounted. Specifically, the input terminal 18 has two terminals of a P terminal and a N terminal connected with a direct-current power supply thorough a smoothing capacitor for stabilizing an operation of the semiconductor device 16. The output terminal 20 has three terminals of a U-phase terminal 20U, a V-phase terminal 20V and a W-phase terminal 20W for a three-phase alternating current outputted from the semiconductor device 16 to supply to a load that is an electric-powered device such as a motor and a compressor. The intermediate terminal 22 has a plurality of terminals connected with a controller for controlling the operation of the semiconductor device 16 that is mounted onto the control substrate 12. As will be described later in detail, each pad portion 18*d* of the input terminal 18, each pad portion 20*du*, 20*dv*, 20*dw* of the output terminal 20 and each pad portion 22*d* of the intermediate terminal 22 are adhered onto surfaces of metal layers as pad surfaces of the insulated substrate 14 by forming solder connecting portions with solders, at window portions opened through an insulated layer to expose the metal layers in the insulated substrate 14, while aligning each pad portion 18*d*, 20*du*, 20*dv*, 20*dw*, 22*d* thereof, correspondingly. Incidentally, as a matter of convenience in explanation, the smoothing capacitor, the direct-current power supply, the load such as the motor and the compressor, and the controller are not shown in the drawings.

Here, in the present embodiment, the input terminal 18 has a structure in which a bus bar 18*bp* of the P terminal is projected along the y-axis direction from a resin main body 18*m* and a bus bar 18*bn* of the N terminal is projected along the y-axis direction from a resin main body 18*m*. In the output terminal 20, the U-phase terminal 20U has a structure in which a bus bar 20*bu* is projected along the x-axis direction from a resin main body 20*mu*, the V-phase terminal 20V has a structure in which a bus bar 20*bv* is projected along the x-axis direction from a resin main body 20*mv* and the W-phase terminal 20W has a structure in which a bus bar 20*bw* is projected along the x-axis direction from a resin main body 20*mw*, respectively. The intermediate terminal 22 has a structure in which a plurality of connecting pins 22*b* are projected along the z-axis direction from a resin main body 22*m*.

That is, in such a structure, the resin main body 18*m* of the input terminal 18, the resin main body 20*mu* of the U-phase terminal 20U, the resin main body 20*mv* of the V-phase terminal 20V, the resin main body 20*mw* of the W-phase terminal 20W and the resin main body 22*m* of the intermediate terminal 22 are separated on the insulated substrate 14 to each other, and thus, each of the input terminal 18, the U-phase terminal 20U of the output terminal 20, the V-phase terminal 20V of the output terminal 20, the W-phase terminal 20W of the output terminal 20 and the intermediate terminal 22 forms a separated module that is spatially independent from the other on the insulated substrate 14.

Next, in such a structure, a method for mounting the input terminal 18, the output terminal 20 and the intermediate terminal 22 onto the insulated substrate 14 will be explained in detail.

Specifically, the resin main body 18*m* of the input terminal 18 is temporarily stuck with a jig, not shown in the drawings, and then, each pad portion 18*d* of the input terminal 18 is adhered onto the surface of the metal layer as the pad surface of the insulated substrate 14 by forming the solder connecting portion with the solder, at the window portion opened through the insulated layer to expose the metal layer in the insulated substrate 14, with each pad portion 18*d* thereof in correct alignment with the surface of the metal layer as the pad surface, correspondingly. Similarly, the resin main bodies 20*mu*, 20*mv* and 20*mw* of the U-phase terminal 20U, the V-phase terminal 20V and the W-phase terminal 20W are temporarily stuck with jigs, not shown in the drawings, and then, the pad portion 20*du* of the U-phase terminal 20U, the pad portion 20*dv* of the V-phase terminal 20V and the pad portion 20*du* of the W-phase terminal 20W are adhered onto the surfaces of the metal layers as the pad surfaces of the insulated substrate 14 by forming the solder connecting portions with the solders, at the window portions opened through the insulated layer to expose the metal layers in the insulated substrate 14, with respective pad portions 20*du*, 20*dv* and 20*dw* thereof in correct alignment with the surfaces of the metal layers as the pad surfaces, correspondingly. Also similarly, the resin main body 22*m* of the intermediate terminal 22 is temporarily stuck with a jig, not shown in the drawings, and then, each pad portion 22*d* of the intermediate terminal 22 is adhered onto the surfaces of the metal layers as the pad surfaces of the insulated substrate 14 by forming the solder connecting portion with the solder, at the window portion opened through the insulated layer to expose the metal layers in the insulated substrate 14, with each pad portion 22*d* thereof in correct alignment with the surfaces of the metal layers as the pad surface, correspondingly.

Accordingly, with such a structure, by causing each of the input terminal, the output terminal and the intermediate terminal to form the separated module that is spatially independent from the other on the insulated substrate, there can be provided the inverter device capable of restraining a positional deviation between the pad surface of the insulated substrate and the pad portion of each terminal. Further, by causing each terminal to form the separated module that is spatially independent from the other on the insulated substrate, there can be provided the inverter device capable of having a general versatility.

Next, in such a structure, an operation of the inverter device 1 will be explained in detail.

Specifically, the bus bar 18*bp* of the P terminal and the bus bar 18*bn* of the N terminal in the input terminal 18 is supplied with the direct current from the direct-current power supply thorough the smoothing capacitor, and on the other hand, the intermediate terminal 22 is supplied with a control signal from the controller through the plurality of the connecting pins 22*b*. Correspondingly to such a situation, the semiconductor device 16 makes a switching operation and a necessarily boosting operation, and resultantly, the three-phase alternating current is outputted of U-phase, V-phase and W-phase correspondingly from the bus bar 20*bu* of the U-phase terminal 20U, the bus bar 20*bv* of the V-phase terminal 20V and the bus bar 20*bw* of the W-phase terminal 20W in the output terminal 20 to the load such as the motor and the compressor, thereby electrically driving the load.

At this point, since the resin main body 18m of the input terminal 18, the resin main body 20mu of the U-phase terminal 20U, the resin main body 20mv of the V-phase terminal 20V and the resin main body 20mw of the W-phase terminal 20W are separated to each other on the insulated substrate 14, that is, each of the input terminal 18, the U-phase terminal 20U of the output terminal 20, the V-phase terminal 20V of the output terminal 20 and the W-phase terminal 20W of the output terminal 20 forms the separated module that is spatially independent from the other on the insulated substrate 14, a mechanical vibration from the smoothing capacitor through the input terminal 18 and a mechanical vibration from the load through the output terminal 20 are transmitted to the insulated substrate 14 having a relatively large vibrational rigidity, and thus, such mechanical vibrations cannot be transmitted to the solder connecting portions of another terminals in direct. Further, since the resin main body 22m of the intermediate terminal 22 is separated to the input terminal 18 and the output terminal 20 on the insulated substrate 14, that is, the intermediate terminal 22 forms a separated module that is spatially independent from the input terminal 18 and the output terminal 20 on the insulated substrate 14, such mechanical vibrations from the smoothing capacitor and from the load cannot be transmitted to the solder connecting portions of the intermediate terminal 22.

Accordingly, with such a structure, by causing each of the input terminal, the output terminal and the intermediate terminal to form the separated module that is spatially independent from the other on the insulated substrate, the mechanical vibrations from the smoothing capacitor and from the load can be transmitted o the insulated substrate and thus, there can be provided the inverter device capable of preventing the mechanical vibrations to be transmitted to the solder connecting portions of another terminals in direct, thereby realizing the inverter device less subject to the mechanical vibration from surroundings including the loads.

Besides, in the inverter device 1 having the separated module terminal of the present embodiment, there is provided the case 10 as the depressing member as aforementioned, and next, a structure of the case 10 will be explained in detail, further with reference to FIGS. 5 to 7.

Figure 5:
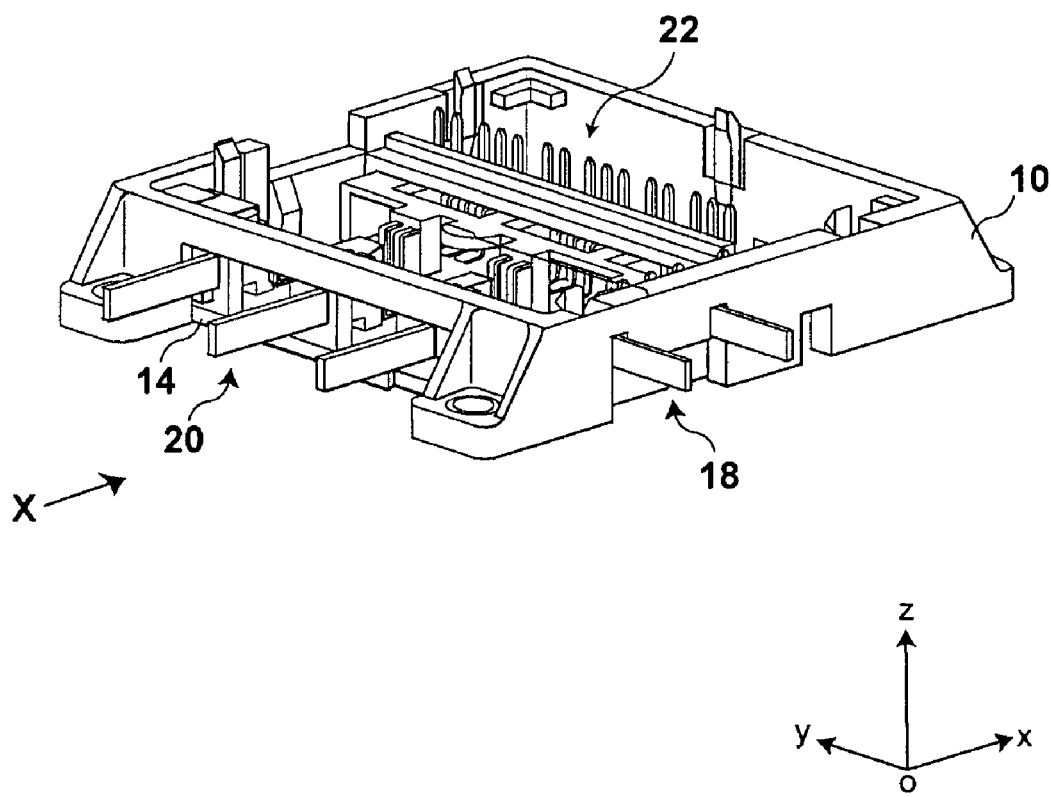
FIG. 5 is a perspective view showing a state in which the insulated substrate mounting the separated module terminal and the like is accommodated in and fixed to a case in the inverter device of the present embodiment.
Figure 6:
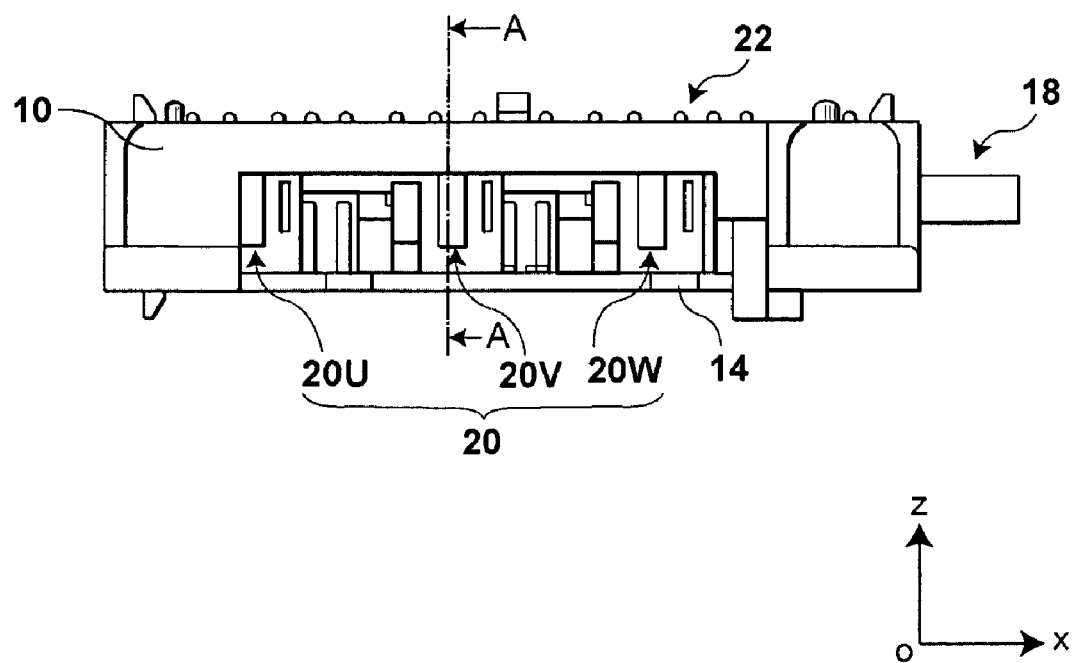
FIG. 6 is a front view along an arrow X of FIG. 5 of the present embodiment.

FIG. 5 is a perspective view showing a state in which the insulated substrate mounting the separated module terminal and the like is accommodated in and fixed to the case in the inverter device of the present embodiment, and FIG. 6 is a front view along an arrow X of FIG. 5 of the present embodiment. Also FIG. 7 is a bottom view of the case viewed along an arrow Z of FIG. 2 of the present embodiment.

As shown in FIGS. 5 and 6, in the inverter device 1 of the present embodiment, the insulated substrate 14 onto which the semiconductor device 16, the input terminal 18, the output terminal 20 and the intermediate terminal 22 are mounted is accommodated in and fixed to the case 10 as the depressing member.

Figure 7:
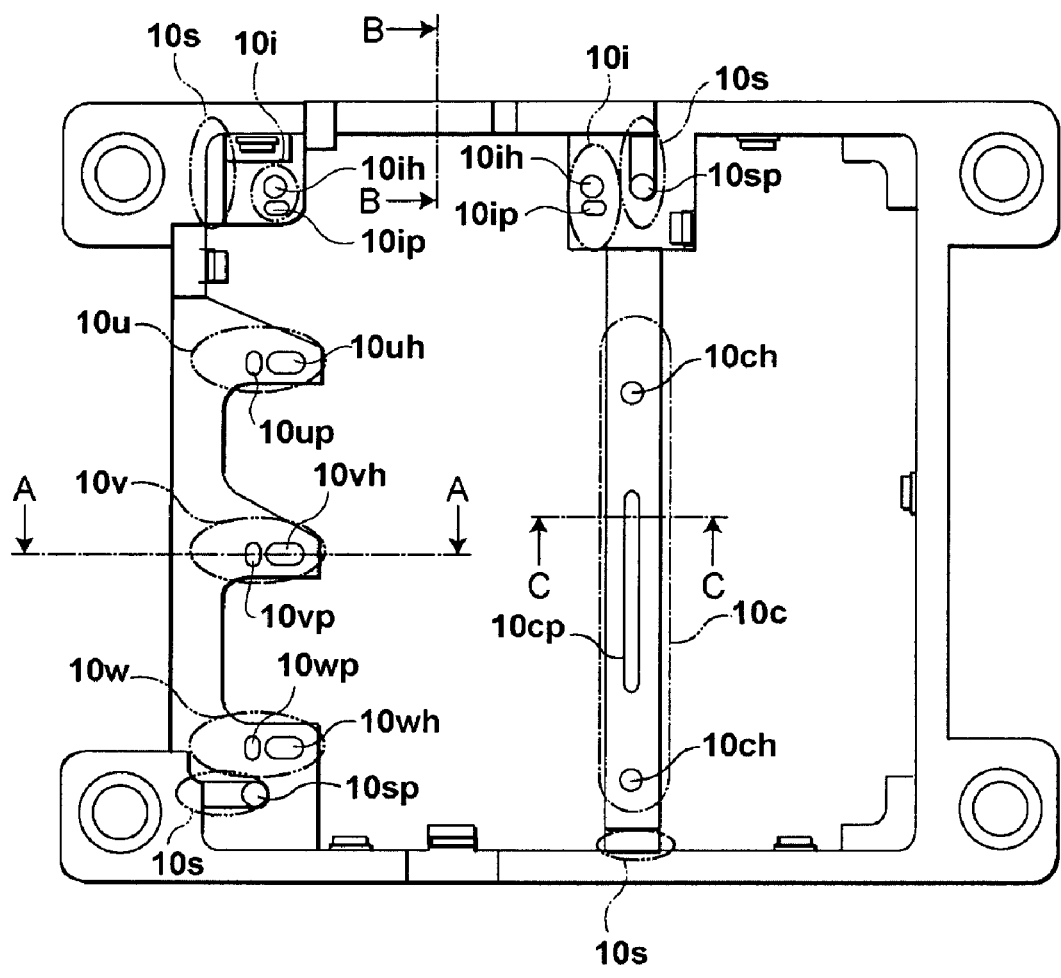
FIG. 7 is a bottom view of the case viewed along an arrow Z of FIG. 2 of the present embodiment.
Figure 7:
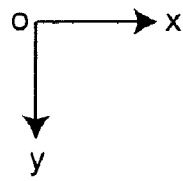

Here, as shown in FIG. 7, at the bottom surface of the case 10, there are provided with four abutting portions 10s for the insulated substrate 14, two abutting portions 10i for the input terminal 18, abutting portions 10u, 10v and 10w correspondingly for the U-phase terminal 20U, the V-phase terminal 20V and the W-phase terminal 20W in the output terminal 20, and one abutting portion 10c for the intermediate terminal 22.

Specifically, in the four abutting portions 10s for the insulated substrate 14, which are the depressing portions capable of depressing the insulated substrate 14, two of the four abutting portions 10s are respectively provided with pins 10sp that are capable of correspondingly fittedly inserting into two holes 14h formed in the insulated substrate 14 as shown in FIG. 4. Also, the two abutting portions 10i for the input terminal 18 are respectively provided with projections 10ip, which are depressing portions capable of correspondingly depressing the resin main body 18m of the input terminal 18, and holes 10ih into which two pins 18p formed on the resin main body 18m of the input terminal 18 as shown in FIGS. 3 and 4 are capable of correspondingly fittedly inserting.

Further, the abutting portions 10u, 10v and 10w for the U-phase terminal 20U, the V-phase terminal 20V and the W-phase terminal 20W in the output terminal 20 are provided with projections 10up, 10vp and 10wp and holes 10uh, 10vh and 10wh, correspondingly. Here, the projections 10up, 10vp and 10wp, which are depressing portions capable of correspondingly depressing the resin main body 20mu of the U-phase terminal 20U, the resin main body 20mv of the V-phase terminal 20V and the resin main body 20mw of the W-phase terminal 20W. Also, a pin 20up formed on the resin main body 20mu of the U-phase terminal 20U, a pin 20vp formed on the resin main body 20mv of the V-phase terminal 20V and a pin 20wp formed on the resin main body 20mw of the W-phase terminal 20W as shown in FIGS. 3 and 4 are capable of correspondingly fittedly inserting into the holes 10uh, 10vh and 10wh.

Further, the abutting portion 10c for the intermediate terminal 22 is provided with one projection 10cp, which is a depressing portion capable of depressing the resin main body 22m of the intermediate terminal 22, and two holes 10ch into which two pins 22p formed on the resin main body 22m of the intermediate terminal 22 as shown in FIGS. 3 and 4 are capable of correspondingly fittedly inserting. Incidentally, such a projection 10cp is not only formed as a continuous projection extending along the y-axis direction as typically shown in FIG. 7 but also formed as a plurality of divided discrete projections arranged along the y-axis direction.

Here, a method for causing the insulated substrate 14, onto which the semiconductor device 16, the input terminal 18, the output terminal 20 and the intermediate terminal 22 are mounted, to be accommodated in and fixed to the case 10, while depressing the insulated substrate 14 by use of the case 10 having such a structure, will be explained in detail, further with reference to FIGS. 8 to 13.

Figure 8:
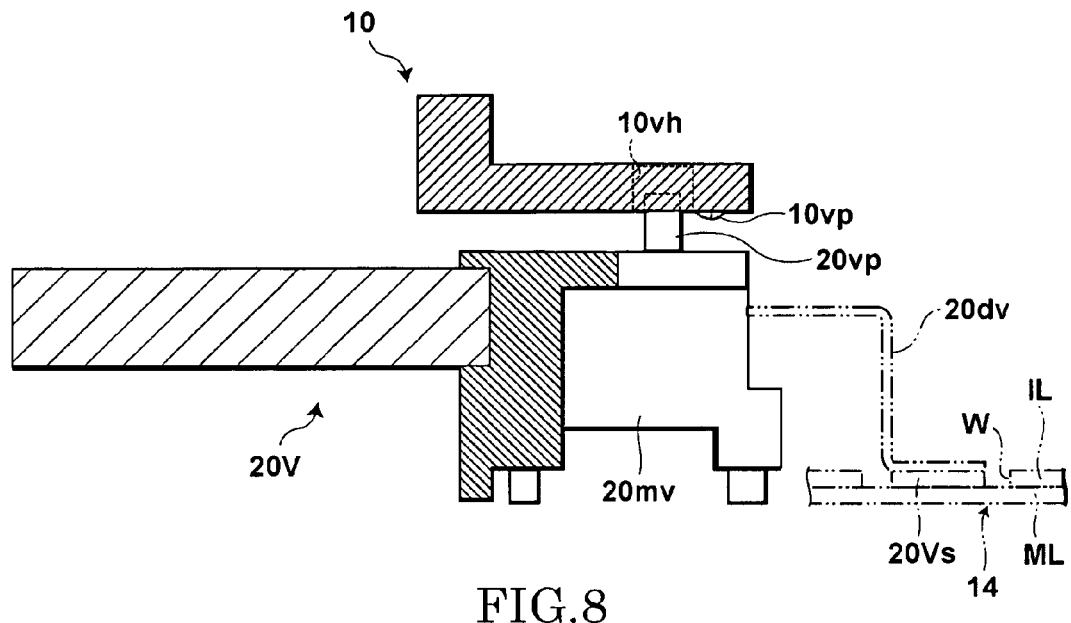
FIG. 8 is an enlarged sectional view taken along the line A-A of each of FIGS. 4, 6 and 7 to show a state in which the case is opposed to the insulated substrate mounting the separated module terminal and the like in the inverter device of the present embodiment.
Figure 9:
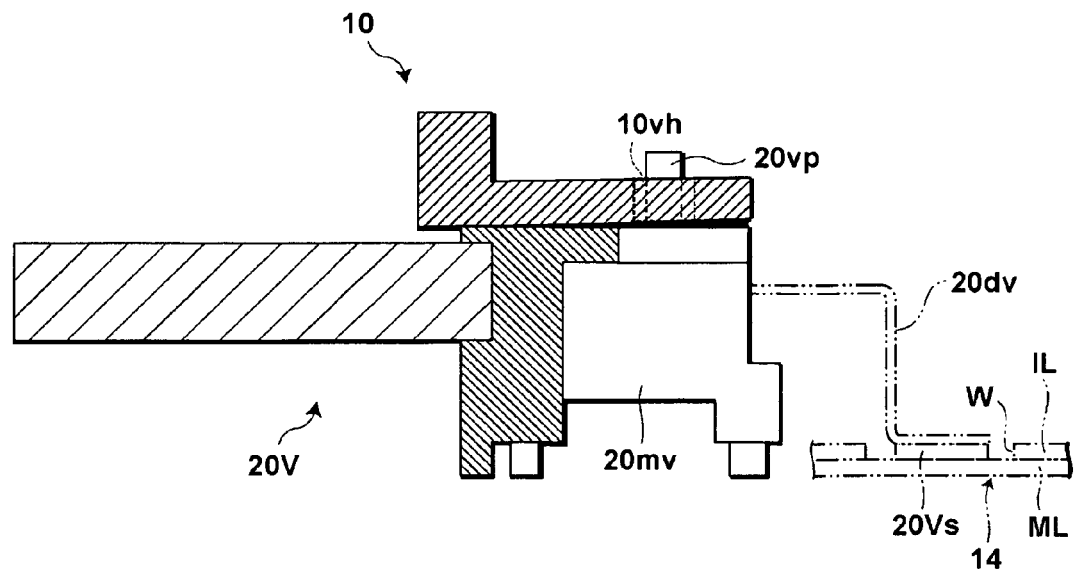
FIG. 9 is an enlarged sectional view taken along the line A-A of each of FIGS. 4, 6 and 7 to show a state in which the case is attached onto the insulated substrate mounting the separated module terminal and the like in the inverter device of the present embodiment.
Figure 10:
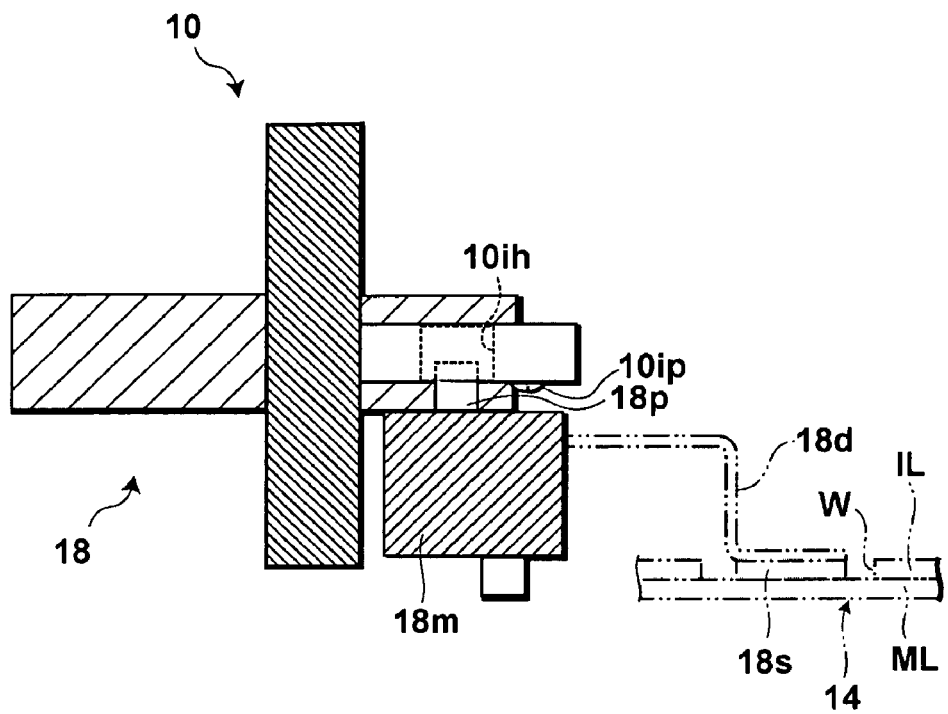
FIG. 10 is an enlarged sectional view taken along the line B-B of each of FIGS. 4 and 7 to show the state in which the case is opposed to the insulated substrate mounting the separated module terminal and the like in the inverter device of the present embodiment.
Figure 11:
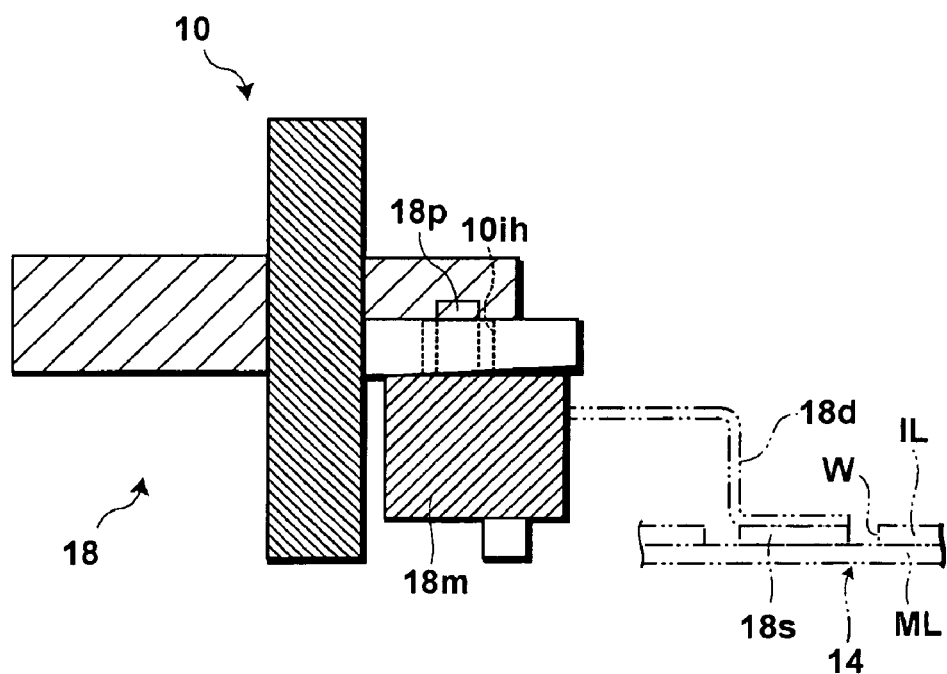
FIG. 11 is an enlarged sectional view taken along the line B-B of each of FIGS. 4 and 7 to show the state in which the case is attached onto the insulated substrate mounting the separated module terminal and the like in the inverter device of the present embodiment.
Figure 12:
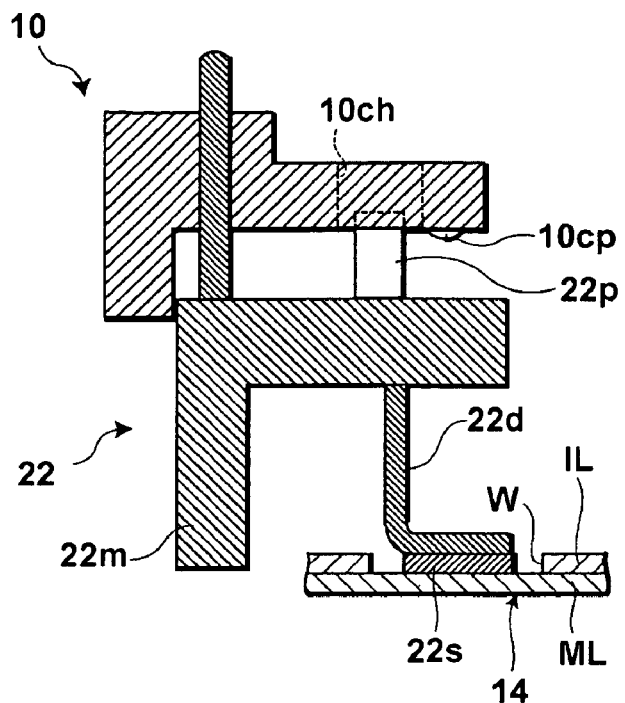
FIG. 12 is an enlarged sectional view taken along the line C-C of each of FIGS. 4 and 7 to show the state in which the case is opposed to the insulated substrate mounting the separated module terminal and the like in the inverter device of the present embodiment.
Figure 13:
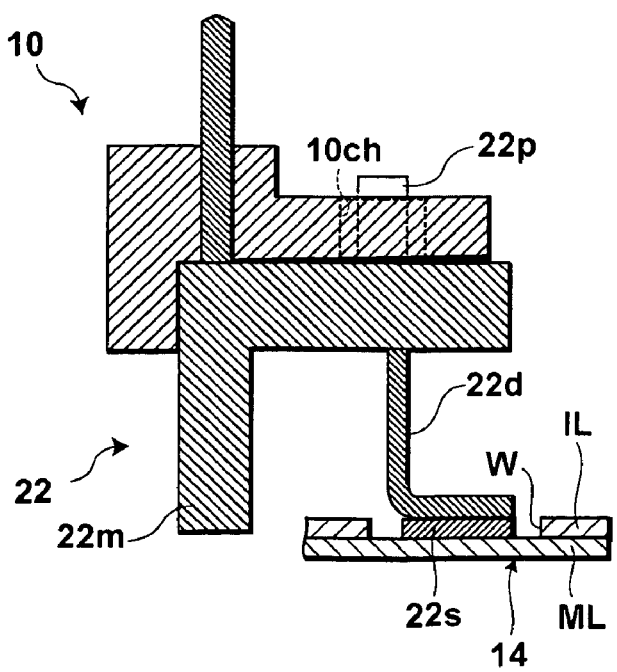
FIG. 13 is an enlarged sectional view taken along the line C-C of each of FIGS. 4 and 7 to show the state in which the case is attached on the insulated substrate mounting the separated module terminal and the like in the inverter device of the present embodiment.

FIGS. 8 and 9 are enlarged sectional views taken along the line A-A of each of FIGS. 4, 6 and 7, with FIG. 8 showing a state in which the case is opposed to the insulated substrate mounting the separated module terminal and the like and FIG. 9 showing a state in which the case is attached onto such an insulated substrate, in the inverter device of the present embodiment. FIGS. 10 and 11 are enlarged sectional views taken along the line B-B of each of FIGS. 4 and 7, with FIG. 10 showing the state in which the case is opposed to the insulated substrate mounting the separated module terminal and the like and FIG. 11 showing the state in which the case is attached onto such an insulated substrate, in the inverter device of the present embodiment. FIGS. 12 and 13 are enlarged sectional views taken along the line C-C of each of FIGS. 4 and 7, with FIG. 12 showing the state in which the case is opposed to the insulated substrate mounting the separated module terminal and the like and FIG. 13 showing the state in which the case is attached on such an insulated substrate, in the inverter device of the present embodiment.

Specifically, the case 10 and the insulated substrate 14, onto which the semiconductor device 16, the input terminal 18, the output terminal 20 and the intermediate terminal 22 as shown in FIGS. 3 and 4, are mounted are opposed to each other, and then, the case 10 is moved toward the insulated substrate 14 along the negative direction of z-axis.

On this occasion, the abutting portions 10u, 10v and 10w of the case 10 are correspondingly opposed to the U-phase terminal 20U, the V-phase terminal 20V and the W-phase terminal 20W in the output terminal 20 to depress them. Here, concerning the V-phase terminal 20V as representatively shown FIGS. 8 and 9, the projection 10vp formed on the abutting portion 10v of the case 10 is abutted onto an upper surface of the resin main body 20mv of the V-phase terminal 20V and depresses the resin main body 20mv downward, while causing the pin 20vp formed on the resin main body 20mv to be entered into the hole 10vh of the case 10 and fittedly inserted into the hole 10vh to position the case 10 and the V-phase terminal 20V. Meanwhile, the pad portion 20dv of the V-phase terminal 20V is adhered onto the surfaces of the metal layer ML in the insulated substrate 14 with the solder connecting portion 20Vs, in correspondence with the window portion W opened through the insulated layer IL in the insulated substrate 14. Since such a solder connecting portion 20Vs is formed at the lower end of the V-phase terminal 20V, the upper surface of the resin main body 20mw of the V-phase terminal 20V, which is the portion that the projection 10vp formed on the abutting portion 10v of the case 10 depresses downward, is located away from the solder connecting portion 20Vs especially to be out of a position directly below the abutting portion 10v. Incidentally, such a situation is similarly applied to the combination between the abutting portion 10u and the U-phase terminal 20U and that between the abutting portion 10w and the W-phase terminal 20w. Also, as a matter of convenience in explanation, the pad portion 20dv, the solder connecting portion 20Vs, the metal layer ML and the insulated layer IL in the insulated are shown with phantom line in the drawings.

Concerning the input terminal 18, as shown in FIGS. 10 and 11, each abutting portion 10i of the case 10 is opposed to the input terminal 18 to depress it. Specifically, each projection 10ip formed on the abutting portion 10i of the case 10 is abutted onto an upper surface of the resin main body 18m of the input terminal 18 and depresses the resin main body 18m downward, while causing each pin 18p formed on the resin main body 18m to be entered into the corresponding hole 10ih of the case 10 and fittedly inserted into the hole 10ih to position the case 10 and the input terminal 18. Here, each pad portion 18d of the input terminal 18 is adhered onto the surfaces of the metal layer ML in the insulated substrate 14 with the solder connecting portion 18s, in correspondence with the window portion W opened through the insulated layer IL in the insulated substrate 14. Since such a solder connecting portion 18s is formed at the lower end of the input terminal 18, the upper surface of the resin main body 18m of the input terminal 18, which is the portion that the projection 10ip formed on the abutting portion 10i of the case 10 depresses downward, is located away from the solder connecting portion 18s especially to be out of a position directly below the abutting portion 10i. Incidentally, as a matter of convenience in explanation, the pad portion 18d, the solder connecting portion 18s, the metal layer ML and the insulated layer IL in the insulated are shown with phantom line in the drawings.

Concerning the intermediate terminal 22, as shown in FIGS. 12 and 13, the abutting portion 10c of the case 10 is opposed to the intermediate terminal 22 to depress it. Specifically, the projection 10cp formed on the abutting portion 10c of the case 10 is abutted onto an upper surface of the resin main body 22m of the intermediate terminal 22 and depresses the resin main body 22m downward, while causing each pin 22p formed on the resin main body 22m to be entered into the corresponding hole 10ch of the case 10 and fittedly inserted into the hole 10ch to position the case 10 and the intermediate terminal 22. Here, the pad portion 22d of the intermediate terminal 22 is adhered onto the surfaces of the metal layer ML in the insulated substrate 14 with the solder connecting portion 22s, in correspondence with the window portion W opened through the insulated layer IL in the insulated substrate 14. Since such a solder connecting portion 22s is formed at the lower end of the intermediate terminal 22, the upper surface of the resin main body 22m of the input terminal 22, which is the portion that the projection 10cp formed on the abutting portion 10c of the case 10 depresses downward, is located away from the solder connecting portion 22s.

Concerning the four abutting portions 10s for the insulated substrate 14, each abutting portions 10s of the case 10 is opposed to the insulated substrate 14 to depress it. Specifically, each abutting portion 10s of the case 10 is abutted onto an upper surface of the insulated substrate 14 and depress it downward, while causing each pin 10sp formed on the abutting portion 10s to be entered into the corresponding hole 14h of the insulated substrate 14 and fittedly inserted into the hole 14h to position the case 10 and the insulated substrate 14.

Resultantly, after the insulated substrate 14, onto which the semiconductor device 16, the input terminal 18, the output terminal 20 and the intermediate terminal 22 are mounted, is accommodated in and fixed to the case 10, with depressing the insulated substrate 14 by use of the case 10, the control substrate 12, onto which the controller is mounted, is fixed to the case 10 and then, such a case 10 is attached to the heat dissipation member, thereby completing the assembly of the inverter device 1 of the present embodiment.

Accordingly, with such a structure, since there is provided the case as the depressing member for depressing the input terminal, the output terminal and the intermediate terminal, the connecting state between the pad surfaces of the insulated substrate and the pad portions of the input terminal, the output terminal and the intermediate terminal can be kept in a reliable condition.

Further, since the case as the depressing member is provided with the depressing portions for depressing the input terminal, the output terminal and the intermediate terminal with the positions away from the solder connecting portions thereof, the case can depress the input terminal, the output terminal and the intermediate terminal without a stress concentration on each older connecting portion, thereby improving the connecting state between the pad surfaces of the insulated substrate and the pad portions of the input terminal, the output terminal and the intermediate terminal in more reliable manner.

In addition, since the case as the depressing member is provided with the depressing portions having the projections as the deformation surfaces for depressing the input terminal, the output terminal and the intermediate terminal, the connecting state between the pad surfaces of the insulated substrate and the pad portions of the input terminal, the output terminal and the intermediate terminal can be kept in more reliable condition, with such a simplified and facilitated structure.

Next, in the inverter device 1 having the separated module terminal of the present embodiment, a modified example of the case 10 as the depressing member will be explained in detail, further with reference to FIGS. 14 to 19.

Figure 14:
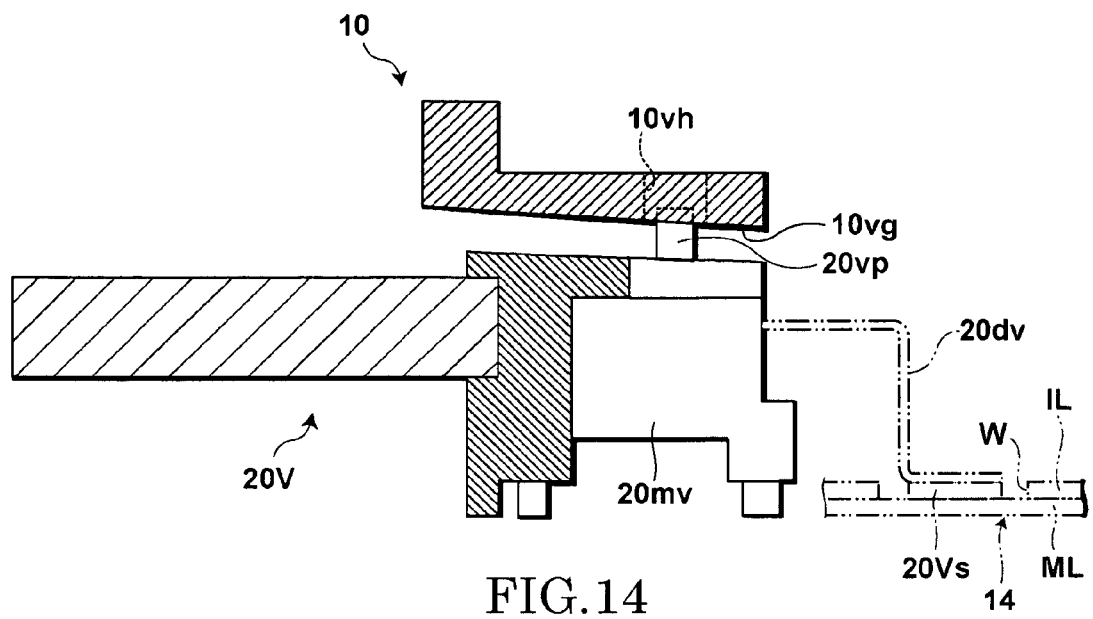
FIG. 14 is an enlarged sectional view positionally corresponding to FIG. 8 in an inverter device of a modified example of the present embodiment.
Figure 15:
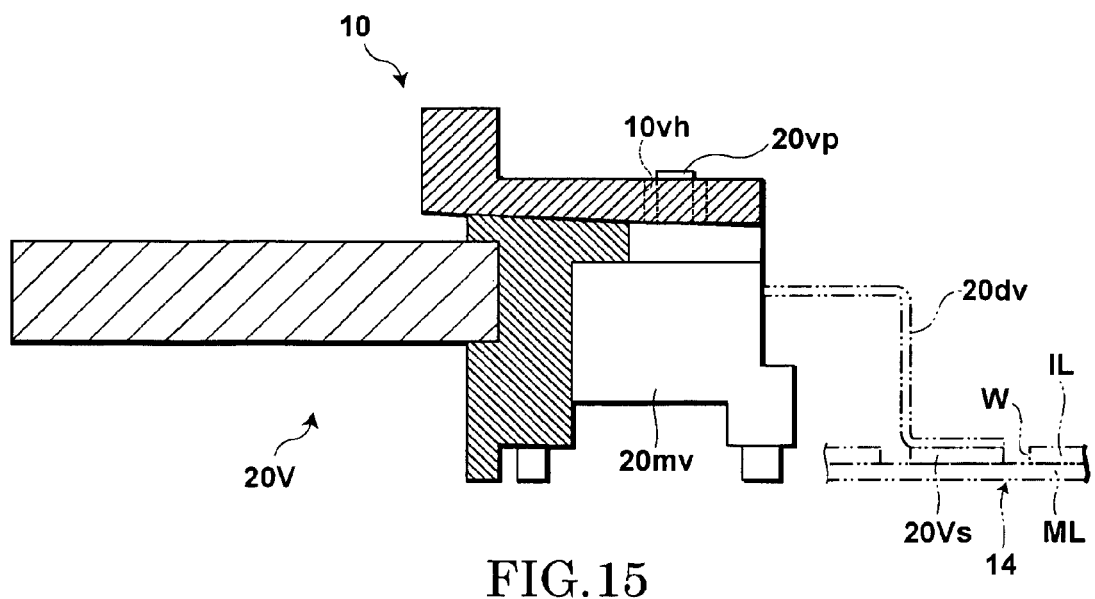
FIG. 15 is an enlarged sectional view positionally corresponding to FIG. 9 in the inverter device of the modified example of the present embodiment.
Figure 16:
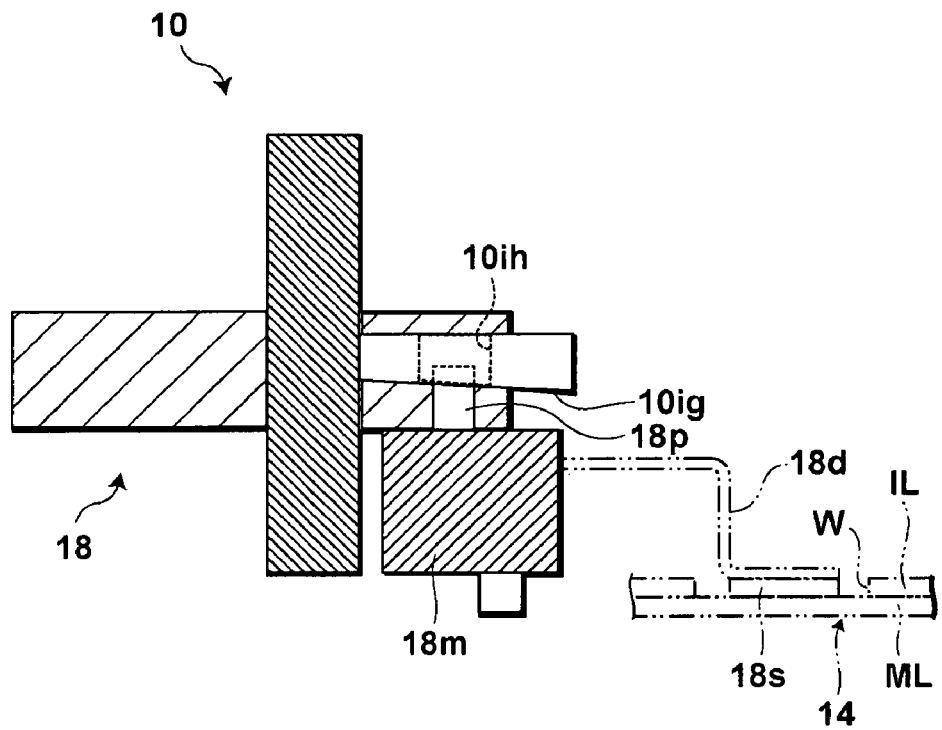
FIG. 16 is an enlarged sectional view positionally corresponding to FIG. 10 in the inverter device of the modified example of the present embodiment.
Figure 17:
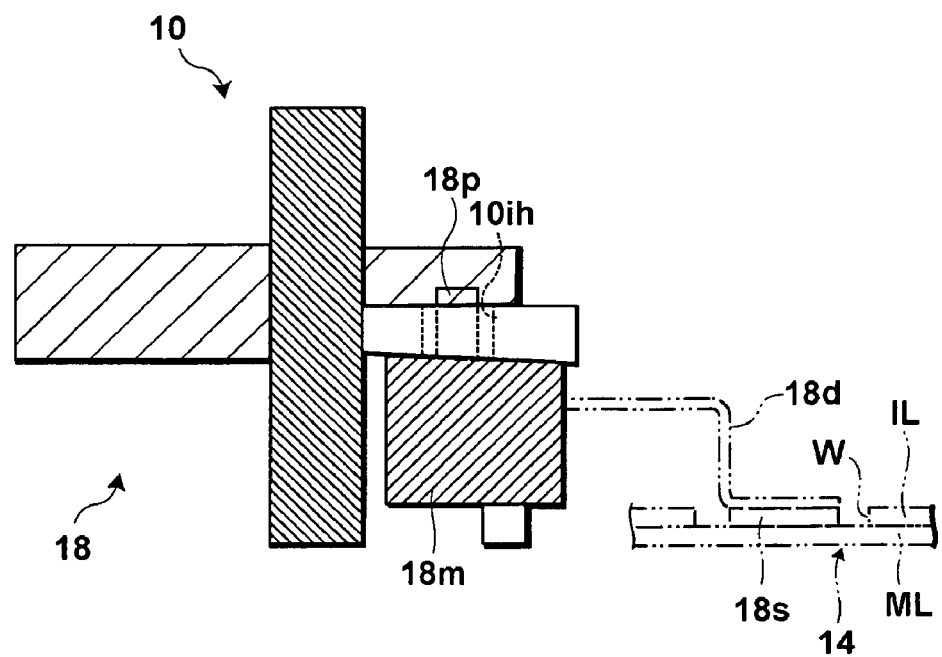
FIG. 17 is an enlarged sectional view positionally corresponding to FIG. 11 in the inverter device of the modified example of the present embodiment.
Figure 18:
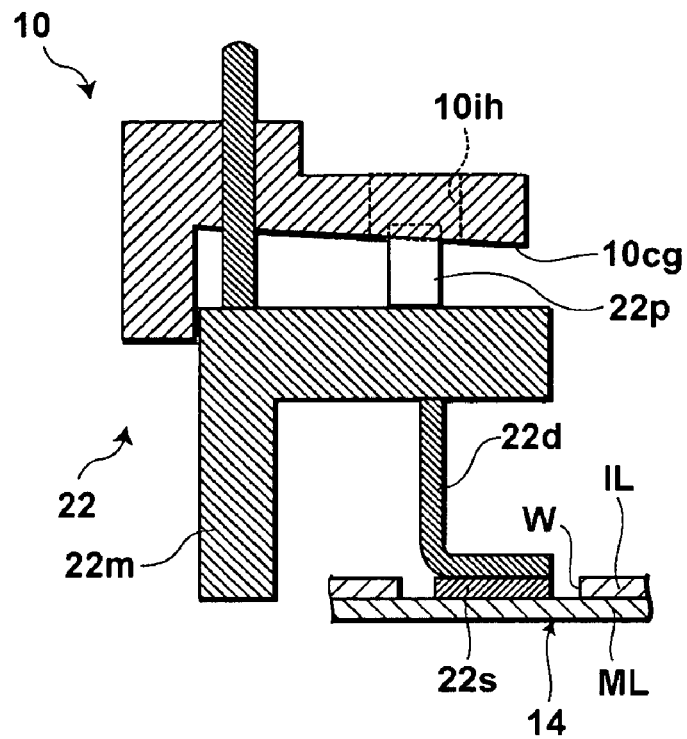
FIG. 18 is an enlarged sectional view positionally corresponding to FIG. 12 in the inverter device of the modified example of the present embodiment.
Figure 19:
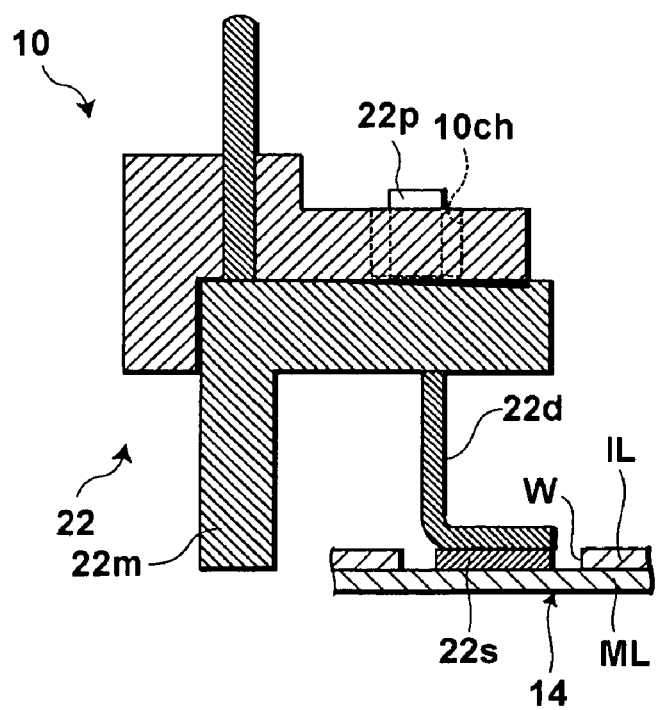
FIG. 19 is an enlarged sectional view positionally corresponding to FIG. 13 in the inverter device of the modified example of the present embodiment.

FIGS. 14, 16 and 18 are enlarged sectional views positionally corresponding to FIGS. 8, 10 and 12 in order to show the state in which the case is opposed to the insulated substrate mounting the separated module terminal and the like in the inverter device of the modified example of the present embodiment. FIGS. 15, 17 and 19 are enlarged sectional views positionally corresponding to FIGS. 9, 11 and 13 to show the state in which the case is attached onto such an insulated substrate, in the inverter device of the modified example of the present embodiment.

In particular, as shown in FIGS. 14 to 19, the structure of the modified example differs from that of the present embodiment aforementioned mainly in the two abutting portions 10*i* of the case 10 for the input terminal 18 that are provided with inclined surfaces 10*ig* instead of the projections 10*ip*, respectively, the abutting portions 10*u*, 10*v* and 10*w* of the case 10 for the U-phase terminal 20U, the V-phase terminal 20V and the W-phase terminal 20W that are provided with inclined surfaces instead of the projections 10*up*, 10*vp* and 10*wp*, respectively (the inclined surface 10*vg* is representatively shown in FIGS. 14 and 15), and the abutting portion 10*c* of the case 10 for the intermediate terminal 22 that is provided with inclined surface 10*cg* instead of the projection 10*cp*, with the residual structure of the modified example that is the same as that of the present embodiment, and therefore, aiming at such a differential point, like component parts bear the same reference numerals while description is suitably omitted. Incidentally, in consideration of the requirement for enhancing the depressing force or the like, such inclined surfaces of the modified example can be applied in combination with the projections as shown in FIGS. 8 to 13.

Accordingly, in the modified example, since the case as the depressing member is provided with the depressing portions having the inclined surfaces as the deformation surfaces for depressing the input terminal, the output terminal and the intermediate terminal, the connecting state between the pad surfaces of the insulated substrate and the pad portions of the input terminal, the output terminal and the intermediate terminal can be kept in a reliable condition, with such a simplified and facilitated structure.

Next, in the inverter device 1 having the separated module terminal of the present embodiment, another modified example of the case 10 as the depressing member will be explained in detail, further with reference to FIGS. 20 to 25.

Figure 20:
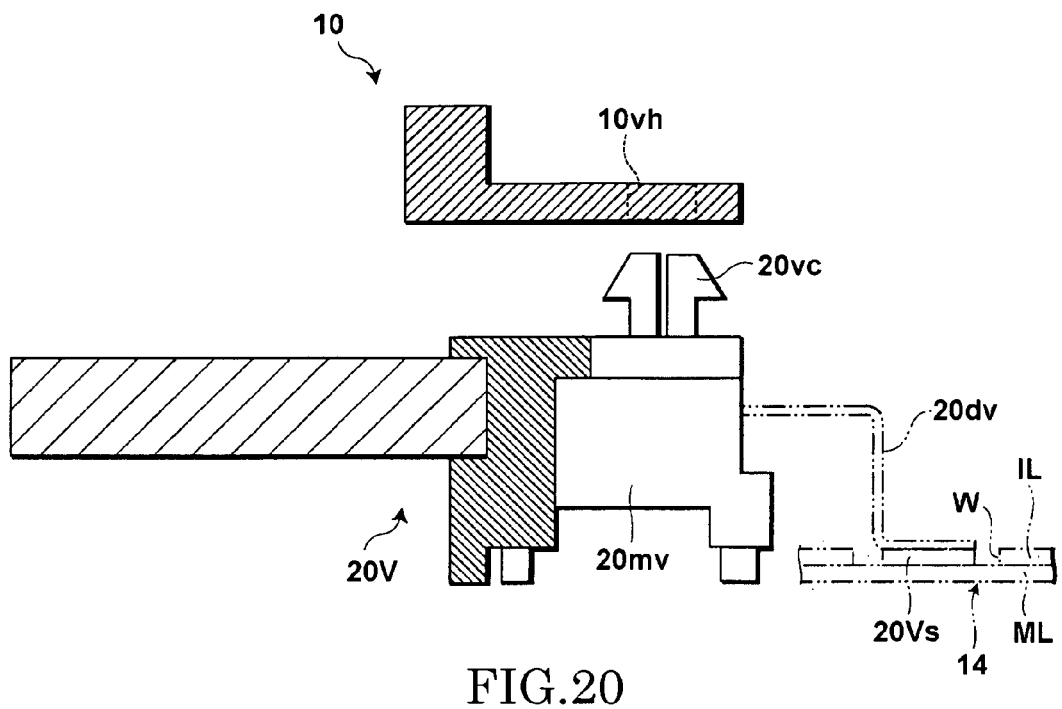
FIG. 20 is an enlarged sectional view positionally corresponding to FIG. 8 in an inverter device of an another modified example of the present embodiment.
Figure 21:
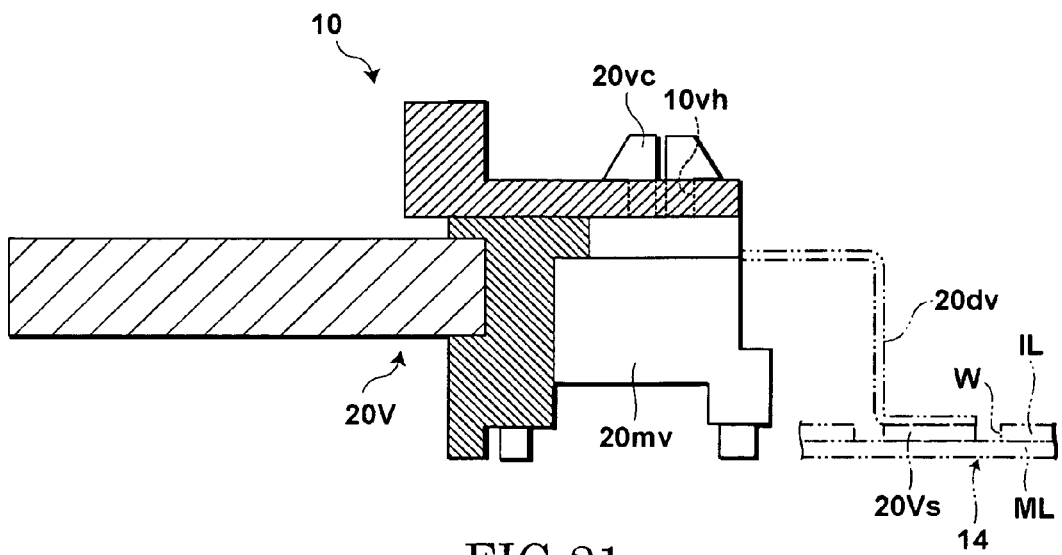
FIG. 21 is an enlarged sectional view positionally corresponding to FIG. 9 in the inverter device of the another modified example of the present embodiment.
Figure 22:
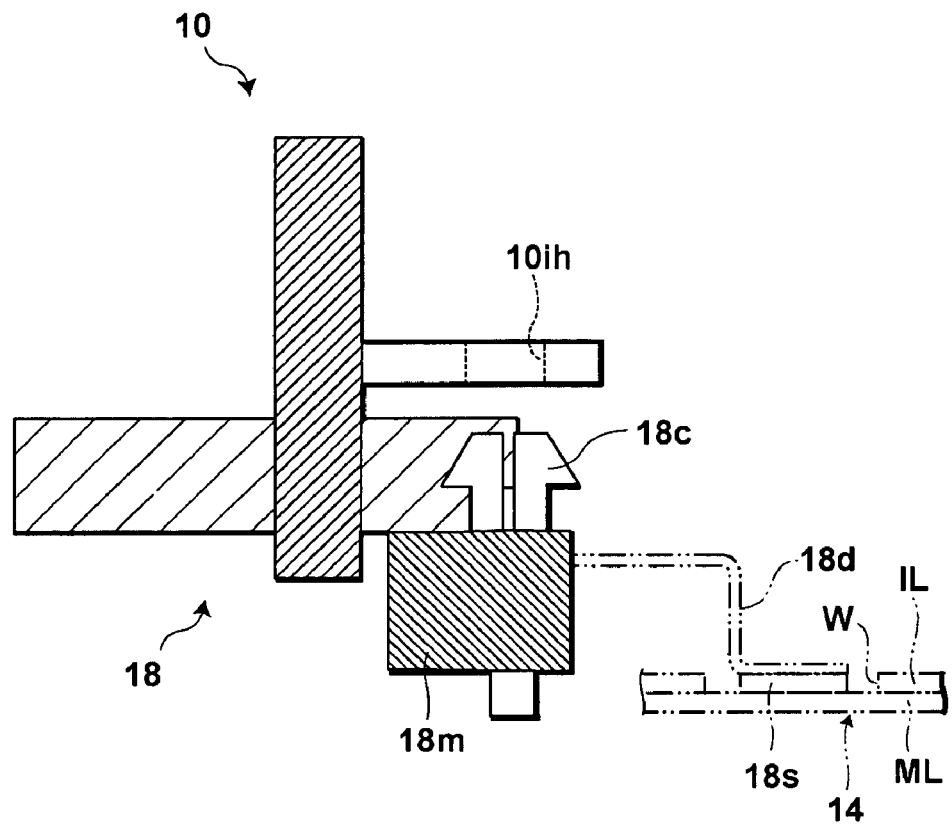
FIG. 22 is an enlarged sectional view positionally corresponding to FIG. 10 in the inverter device of the another modified example of the present embodiment.
Figure 23:
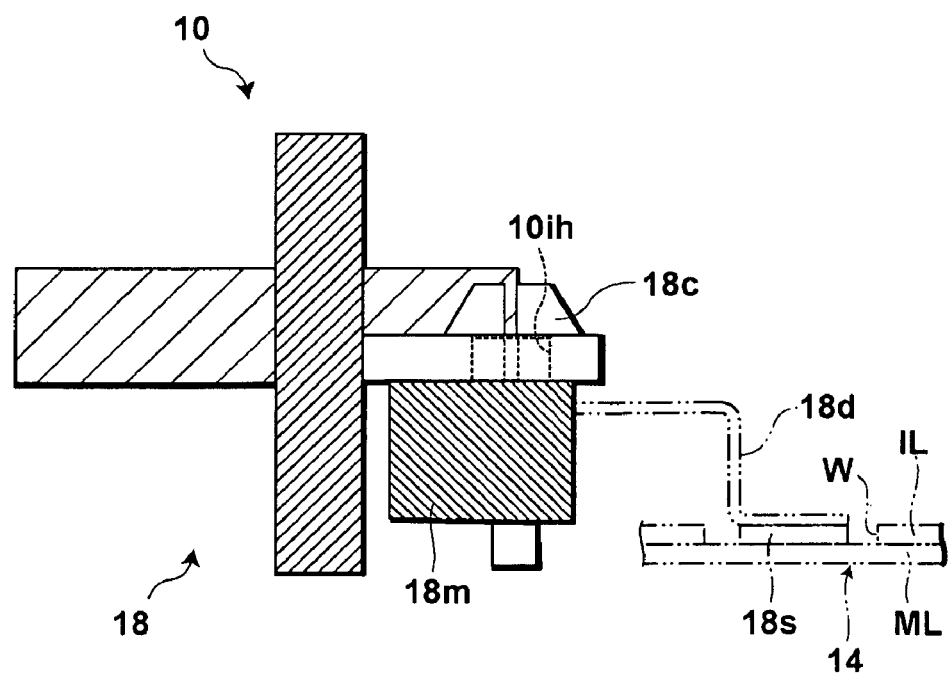
FIG. 23 is an enlarged sectional view positionally corresponding to FIG. 11 in the inverter device of the another modified example of the present embodiment.
Figure 24:
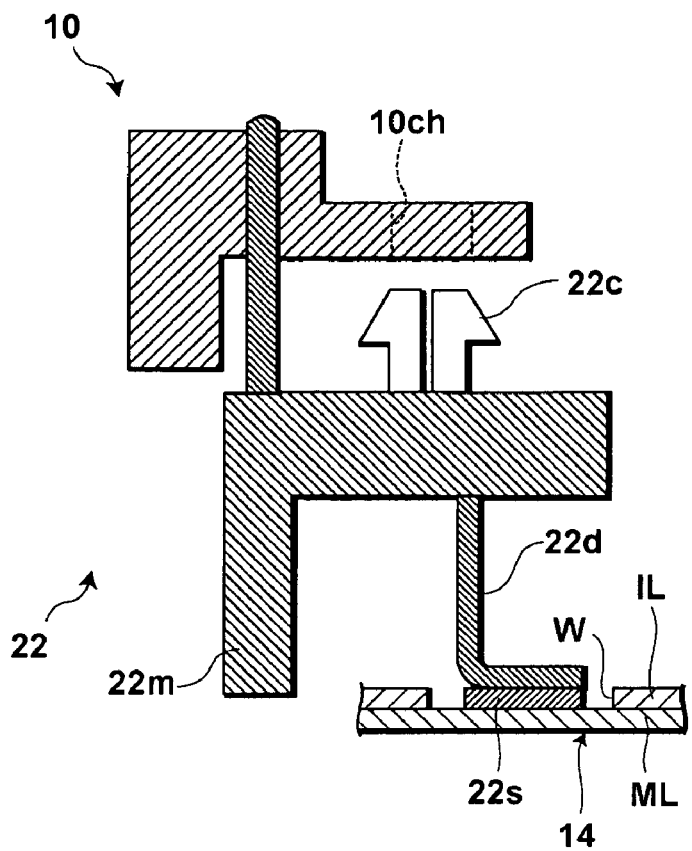
FIG. 24 is an enlarged sectional view positionally corresponding to FIG. 12 in the inverter device of the another modified example of the present embodiment.
Figure 25:
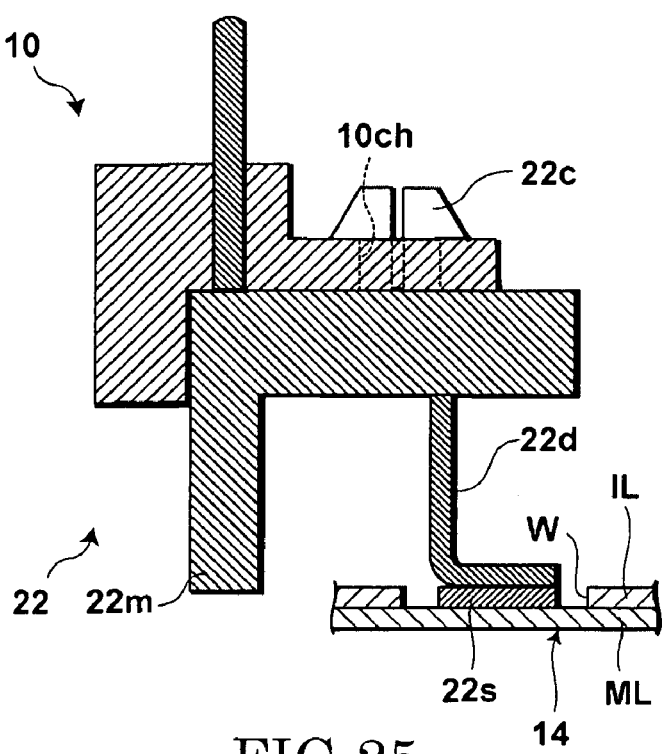
FIG. 25 is an enlarged sectional view positionally corresponding to FIG. 13 in the inverter device of the another modified example of the present embodiment.

FIGS. 20, 22 and 24 are enlarged sectional views positionally corresponding to FIGS. 8, 10 and 12 in order to show the state in which the case is opposed to the insulated substrate mounting the separated module terminal and the like in the inverter device of the another modified example of the present embodiment. FIGS. 21, 23 and 25 are enlarged sectional views positionally corresponding to FIGS. 9, 11 and 13 to show the state in which the case is attached onto such an insulated substrate, in the inverter device of the another modified example of the present embodiment.

In particular, as shown in FIGS. 20 to 25, the structure of the another modified example differs from that of the present embodiment aforementioned mainly in the resin main body 18*m* of the input terminal 18 that is provided with split pins 18*c* to correspondingly hook the abutting portions 10*i*, instead of the pins 18*p*, respectively, the resin main body 20*mu* of the U-phase terminal 20U, the resin main body 20*mv* of the V-phase terminal 20V and the resin main body 22*m* of the intermediate terminal 22 that are provided with split pins 20*vc* and the like to correspondingly hook the abutting portions 10*v* and the like, instead of the pins 20*up*, 20*vp* and 20*wp* (the split pin 20*vc* is representatively shown in FIGS. 20 and 21), and the resin main body 22*m* of the intermediate terminal 22 that is provided with split pins 22*c* to correspondingly hook the abutting portions 10*c*, instead of the pins 22, with the residual structure of the another modified example that is the same as that of the present embodiment, and therefore, aiming at such a differential point, like component parts bear the same reference numerals while description is suitably omitted. Incidentally, in consideration of the requirement for enhancing the depressing force or the like, such split pins of the another modified example can be applied in combination with the projections as shown in FIGS. 8 to 13.

In addition, although the structure of the another modified example is applicable to both of the structure provided with the case having the projections as shown in FIGS. 8 to 13 and that provided with the case having the inclined surfaces as shown in FIGS. 14 to 19, depending on circumstances, it is applicable to the structure provided with the case having only a flat surface without such projections and inclined surfaces.

Accordingly, in the another modified example, since the case as the depressing member can be kept by the split pins, the connecting state between the pad surfaces of the insulated substrate and the pad portions of the input terminal, the output terminal and the intermediate terminal can be kept in a reliable condition, with such a simplified and facilitated structure.

Reference is hereby made to a Patent Application No. TOKUGAN 2007-229883 with a filing date of Sep. 5, 2007 in Japan, the entire content of which is incorporated herein by reference.

The present invention is not to be limited by the present embodiment including the modified examples with several kinds, locations and numbers of the structural elements aforementioned, and it is needless to say that such structural elements can be replaced with those having equivalent operations and effects within the gist of the present invention. The scope of the invention is defined with reference to the following claims.

What is claimed is:

1. An inverter device, comprising:
   a semiconductor device;
   an input terminal;
   an intermediate terminal;
   an output terminal; and
   an insulated substrate on which the semiconductor device, the input terminal, the intermediate terminal and the output terminal are mounted,
   wherein the input terminal has a resin main body, a bus bar projected from the resin main body and a pad portion connected to the insulated substrate, the intermediate terminal has a resin main body, a connecting pin projected from the resin main body and a pad portion connected to the insulated substrate, and the output terminal has a resin main body, a bus bar projected from the resin main body and a pad portion connected to the insulated substrate,
   wherein the pad portion of each of the input terminal, the intermediate terminal and the output terminal is adhered onto a surface of a metal layer as a pad surface of the insulated substrate by forming a solder connecting portion therebetween, while being aligned to the surface of the metal layer as the pad surface,
   and wherein the resin main body of each of the input terminal, the intermediate terminal and the output terminal is separated one another on the insulated substrate, with each of the input terminal, the intermediate terminal and the output terminal being for the semiconductor device to be an separated module such that one of the input terminal, the intermediate terminal and the output terminal is spatially independent from the other.

2. The inverter device according to claim 1, wherein further comprising a depressing member depressing the input terminal, the intermediate terminal and the output terminal each of which is the separated module.

3. The inverter device according to claim 2, wherein the depressing member has a depressing portion depressing each of the input terminal, the intermediate terminal and the output terminal downward from above at a position distant from the solder connecting portion.

4. The inverter device according to claim 3, wherein the depressing portion has a deformation surface deformed toward each of the input terminal, the intermediate terminal and the output terminal.

5. The inverter device according to claim 3, wherein each of the input terminal, the intermediate terminal and the output terminal has a split pin projecting toward the depressing portion.

* * * * *